United States Patent
Pandhumsoporn et al.

(10) Patent No.: US 7,985,688 B2
(45) Date of Patent: Jul. 26, 2011

(54) NOTCH STOP PULSING PROCESS FOR PLASMA PROCESSING SYSTEM

(75) Inventors: Tamarak Pandhumsoporn, Fremont, CA (US); Alferd Cofer, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1172 days.

(21) Appl. No.: 11/305,440

(22) Filed: Dec. 16, 2005

(65) Prior Publication Data

US 2007/0141847 A1    Jun. 21, 2007

(51) Int. Cl.
*H01L 21/302* (2006.01)
(52) U.S. Cl. ........ 438/706; 438/708; 438/689; 438/694; 438/710; 257/296; 257/421; 257/414
(58) Field of Classification Search .................. 438/708, 438/689, 694, 706, 710; 257/296, 414, 421
See application file for complete search history.

(56) References Cited

U.S. PATENT DOCUMENTS

| | | | |
|---|---|---|---|
| 5,188,704 A | 2/1993 | Babie et al. | |
| 6,187,685 B1 | 2/2001 | Hopkins et al. | |
| 6,531,349 B2 | 3/2003 | Yoshida et al. | |
| 6,899,817 B1 | 5/2005 | Becker et al. | |
| 6,905,626 B2 | 6/2005 | Westerman et al. | |
| 6,905,737 B2 | 6/2005 | Verplancken et al. | |
| 6,905,969 B2 | 6/2005 | DeOrnellas et al. | |
| 6,926,844 B1 | 8/2005 | Laermer et al. | |
| 7,351,664 B2 | 4/2008 | Pandhumsoporn et al. | |
| 2001/0001743 A1* | 5/2001 | McReynolds | 438/710 |
| 2002/0052111 A1 | 5/2002 | Paterson et al. | |
| 2003/0003748 A1 | 1/2003 | Khan et al. | |
| 2004/0077178 A1* | 4/2004 | Yang et al. | 438/710 |
| 2005/0009358 A1 | 1/2005 | Choi et al. | |
| 2005/0032386 A1 | 2/2005 | Chang et al. | |
| 2005/0205862 A1 | 9/2005 | Koemtzopoulos et al. | |
| 2005/0227378 A1 | 10/2005 | Moise et al. | |

OTHER PUBLICATIONS

U.S. Appl. No. 11/421,000;Filed May 30, 2006; Inventors: Pandhumsoporn, et al.
International Search Report, mailed Sep. 11, 2007, for PCT Application No. PCT/US06/61705; Filed on Dec. 6, 2006; Inventors: Lam Research Corporation.
Written Opinion, mailed Sep. 11, 2007, for PCT Application No. PCT/US06/61705; Filed on Dec. 6, 2005: Lam Research Corporation.
"International Preliminary Report on Patentability", Issued in PCT Application No. PCT/US2006/061705; Mailing Date: Jun. 26, 2008.

(Continued)

*Primary Examiner* — Nadine G Norton
*Assistant Examiner* — Maki A Angadi
(74) *Attorney, Agent, or Firm* — IP Strategy Group, P.C.

(57) ABSTRACT

A method for etching a substrate having a silicon layer in a plasma processing chamber having a bottom electrode on which the substrate is disposed on during etching. The method includes performing a main etch step. The method also includes terminating main etch step when a predefined etch depth of at least 70 percent of thickness into silicon layer is achieved. The method further includes performing an overetch step. The overetch step including a first process step and a second process step. First process step is performed using a first bottom power level applied to bottom electrode. Second process step is performed using a second bottom power level applied to bottom electrode that is lower than first bottom power level. First process and second process steps are alternately performed a plurality of times. The method yet also includes terminating overetch step after silicon layer is etched through.

31 Claims, 6 Drawing Sheets

OTHER PUBLICATIONS

"Written Opinion", Issued in PCT Application No. PCT/US2006/061705; Mailing Date: Jun. 26, 2008.

"International Preliminary Report on Patentability", issued in PCT Application No. PCT/US2007/069910; Mailing Date: Dec. 18, 2008.

"First Office Action", CN Application No. 200780020182.7; Mailing Date: Apr. 30, 2010.

"International Search Report," Issued in PCT Application No. PCT/US2007/069910; Mailing Date: Jan. 24, 2008.

"Written Opinion", Issued in PCT Application No: PCT/US2007/069910; Mailing Date: Jan. 24, 2008.

"Non Final Office Action", U.S. Appl. No. 11/421,000, Mailing Date: Feb. 21, 2007.

"Final Office Action", U.S. Appl. No. 11/421,000, Mailing Date: Jun. 19, 2007.

* cited by examiner

NOTCH STOP PULSING PROCESS FOR PLASMA PROCESSING SYSTEM

BACKGROUND OF THE INVENTION

Advances in plasma processing have provided for growth in the semiconductor industry. Substrate may be processed in a series of operations in which materials are deposited and selectively removed (etching) in order to form trenches, vias, and other features thereon. Consider the situation wherein, for example, a silicon substrate having an insulator layer and a silicon layer is being etched using fluorinated gases such as $SF_6$, $NF_3$, and $CF_4$. A trench may be formed during a vertical etch into a silicon layer. Etching stops when an insulator layer is reached. One skilled in the art is aware that fluorinated gases are less effective etchants of insulator layers, which may be a dielectric formed from organic and/or inorganic materials. Thus, when an etchant reaches the insulator layer, lateral etching may occur on either side of a trench sidewall.

Figure 1:
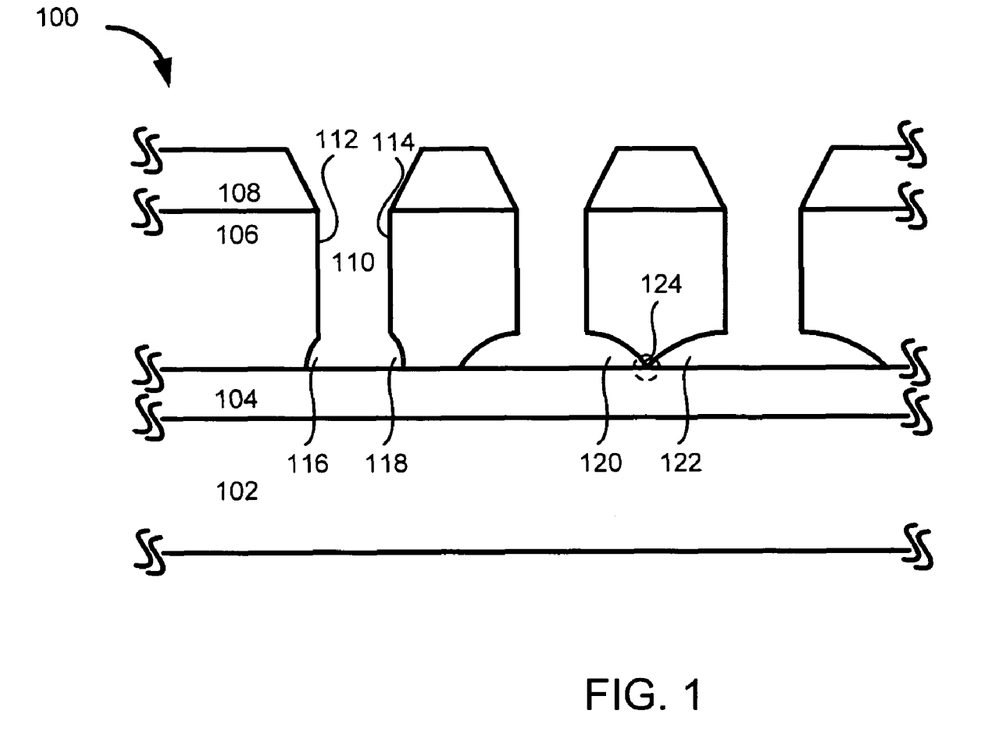
FIG. 1 shows an example of a silicon substrate with notches.

To facilitate discussion, FIG. 1 shows an example of a silicon substrate with notches. A substrate 100 may include a silicon base layer 102. An insulator layer 104 is disposed below a silicon layer 106 which may be disposed below a hard mask layer 108. To etch silicon layer 106, a fluorinated gas may be used to form a trench 110. When insulator layer 104 is reached, fluorinated gases may begin etching away at sidewalls 112 and 114 of trench 110 to create notches (116 and 118).

Notching, or undercutting into silicon layer 106, is undesirable because it may cause unreliability or yield loss in a final product such as a micro electromechanical system (MEMS) device. In some examples, if notches undercut too much of the silicon layer, other device features may be compromised. In an example, notches 120 and 122 have joined together to create a breakthrough 124 which may result in a defective device.

Notching may occur in both high and low frequency plasma processing systems. In a high frequency system, lateral etching component may be more difficult to control, which may result in more notching. Consequently, some manufacturing companies have sacrificed benefits, such as faster etching of a high frequency plasma system, by reverting back to low frequency plasma systems in order to gain control of the lateral etching component.

Since silicon semiconductor industry is a highly competitive market, manufacturing companies are seeking more viable solutions for resolving the notching issues.

SUMMARY OF INVENTION

The invention relates, in an embodiment, in a plasma processing chamber, a method for etching a substrate having thereon a silicon layer. The plasma processing chamber has a bottom electrode. The substrate is disposed on the bottom electrode during the etching. The method includes performing a main etch step. The method also includes terminating the main etch step when a predefined etch depth into the silicon layer is achieved. The predefined etch depth is at least 70 percent of a thickness of the silicon layer. The method further includes performing an overetch step. The overetch step including a first process step and a second process step. The first process step is performed using a first bottom power level applied to the bottom electrode. The second process step is performed using a second bottom power level applied to the bottom electrode that is lower than the first bottom power level. The first process step and the second process step are alternately performed a plurality of times. The method yet also includes terminating the overetch step after the silicon layer is etched through.

In another embodiment, the invention relates to, in a plasma processing chamber, a method for etching a substrate having thereon a silicon layer. The plasma processing chamber has a bottom electrode. The substrate is disposed on the bottom electrode during the etching. The method includes performing a main etch step. The main etch step includes a first process step and a second process step. The first process step employs a first process recipe that is configured to remove more silicon material from the silicon substrate than a second process recipe employed by the second process step. The method also includes terminating the main etch step when a predefined etch depth into the silicon layer is achieved. The predefined etch depth is at least 70 percent of a thickness of the silicon layer. The method further includes performing an overetch step. The overetch step includes a third process step and a fourth process step. The third process step is performed using first bottom power level applied to the bottom electrode. The fourth process step is also performed using a second bottom power level applied to the bottom electrode that is lower than the first bottom power level. The third process step and the fourth process step are alternately performed a plurality of times. The method yet also includes terminating the overetch step after the silicon layer is etched through.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with embodiments of the present invention, there is provided a method for processing substrates to form semiconductor devices in a plasma processing system. Embodiments of the invention provide for a notch stop pulsing process (NSPP) in which the etching process may be manipulated to substantially decrease the lateral etching component resulting in less notching.

In this document, various implementations may be discussed using a high frequency plasma system. This invention, however, is not limited to high frequency plasma system and may be employed in other plasma system, including a low frequency plasma system. As discussed herein, high frequency refers to a bottom RF frequency of 13.56 megahertz or higher. Also, as discussed herein, low frequency refers to a bottom RF frequency below 13.56 megahertz, more preferably about 50 kilohertz to about 900 kilohertz.

Figure 2:
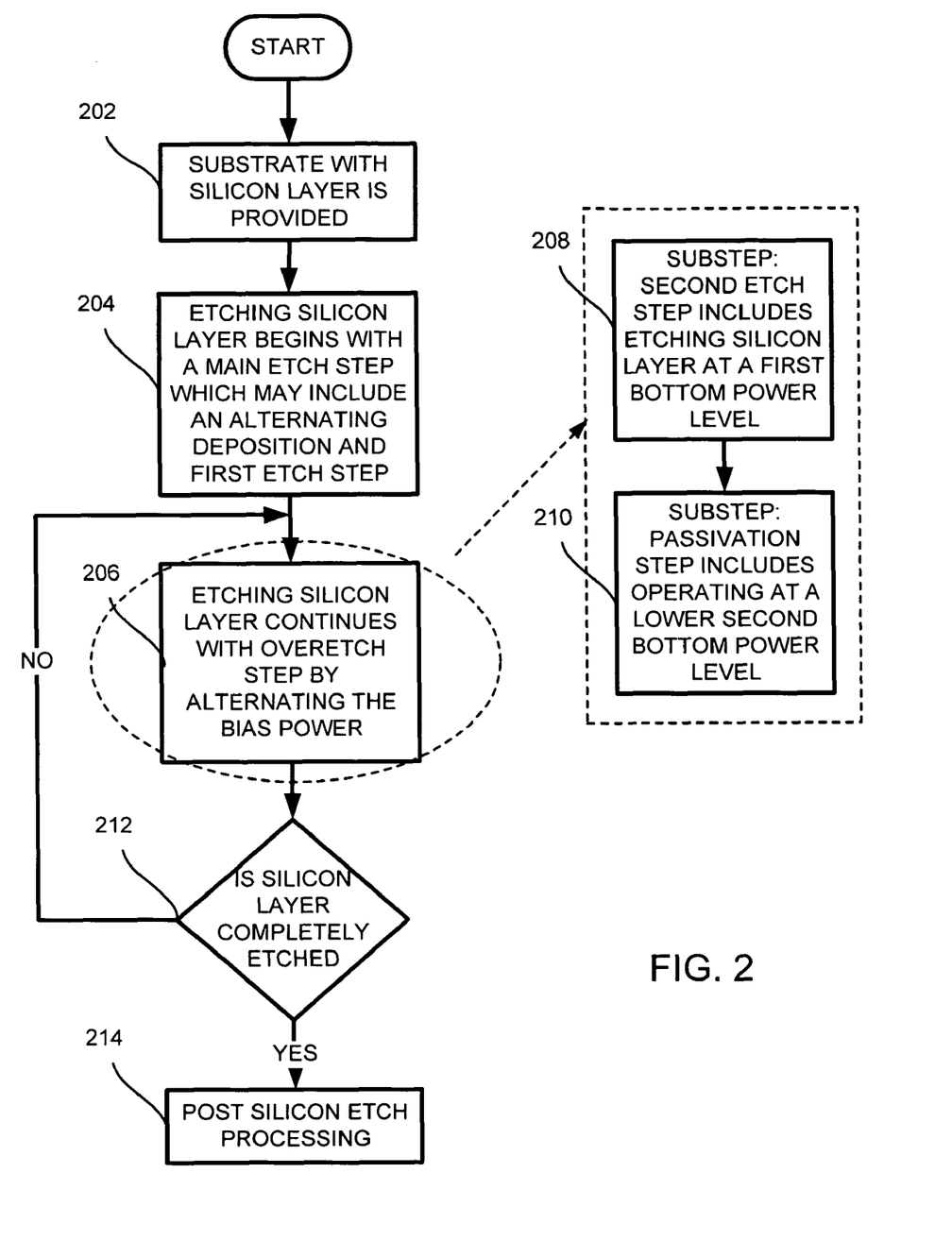
FIG. 2 shows, in an embodiment, a simple flowchart diagramming steps for a notch stop pulse process (NSPP).
Figure 3:
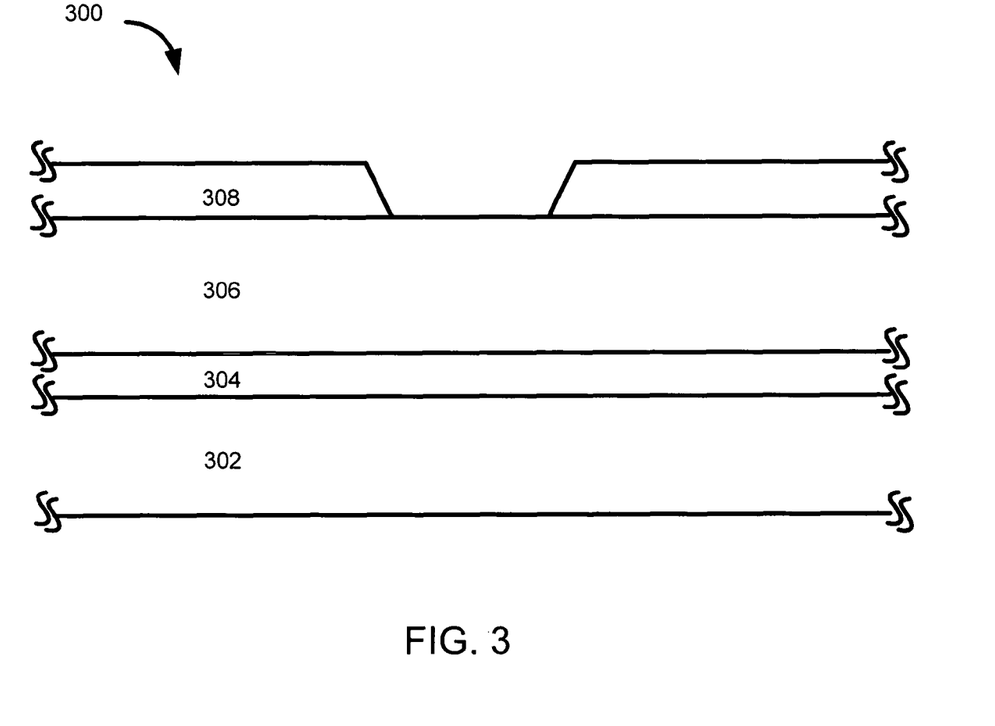
FIG. 3 shows, in an embodiment, a simple diagram of an example of a silicon substrate prior to being processed in a plasma processing system.

FIG. 2 shows, in an embodiment, a simple flowchart diagramming steps for a notch stop pulse process (NSPP). FIG. 2 is discussed in relation to FIGS. 3, 4, 5, and 6. A NSPP may be used to etch a silicon layer of a substrate. At a first step 202, a substrate with a silicon layer is provided. The silicon layer may be disposed above an insulator layer. In an embodiment, NSPP may include a two step process: a main etch step and an overetch step. FIG. 3 shows, in an embodiment, a simple diagram of an example of a silicon substrate prior to being processed in a plasma processing system such as a LAM 9400 DSiE™ system. A silicon substrate 300 may include a silicon base layer 302, an insulator layer 304, a silicon layer 306, and a hard mask 308 or resist mask. Silicon layer 306, such as polysilicon, epitaxial silicon, and monocrystalline, may be of varying thickness depending upon device requirement. The trenches formed in silicon layer 302 over insulator layer 304 may be etched to form device structure above silicon substrate 302. Insulator layer 304 may be a dielectric formed from organic and/or inorganic materials. Thus, insulator layer 304 may be utilized to prevent undesirable etching of substrate base layer 302.

Referring back to FIG. 2, at a next step 204, etching silicon layer may begin with a main etch step. In an embodiment, main etch step 204 may include etching silicon layer 306 to an approximate depth toward insulator layer 304. Also, main etch step 204 may include a first process recipe to perform substantially vertical etch on a considerable portion of silicon layer 306. Since the thickness of the silicon material is generally known, a threshold point that triggers a next step of NSPP may be applied at an empirically determined-depth. Etching that may occur at main etch step 204 may be considered a fast etch since silicon layer 306 may be etched at a quicker rate thus reducing undercutting into sidewalls of silicon layer 306. When a greater percentage of silicon layer 306 is etched at a faster rate without incurring notching, a faster, more consistent etch process results. In an embodiment, test results have shown a fast etching rate may be applied to the upper 90 percent approximately of the silicon layer. Notching usually is a concern on the remaining thickness of the silicon layer.

Figure 4:
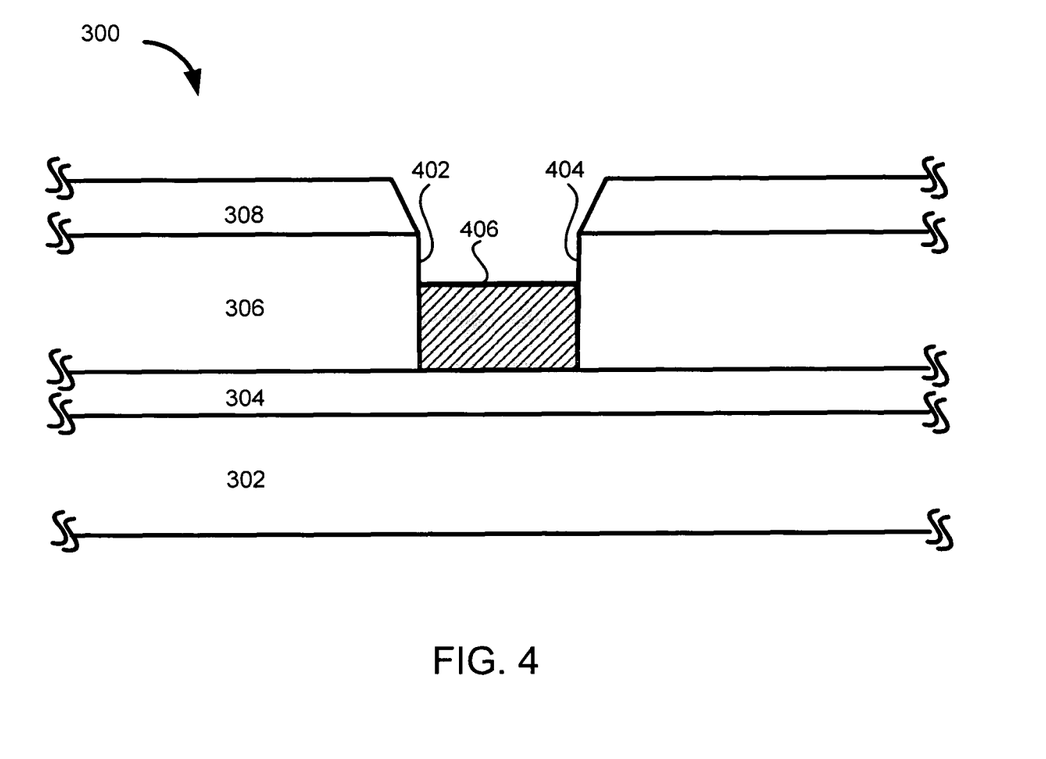
FIG. 4 shows, in an embodiment, a substrate during a main etch step.

FIG. 4 shows, in an embodiment, a substrate during main etch step 204. Main etch step 204 may include any number of intermediate steps. In an embodiment, main etch step 204 may be an alternating deposition step and etching process having a deposition step as a first step follow by etch step. To allow passivation and etching to occur, the gas mixture may change. In the first etch step, a fluorinated based gas may be used. In the deposition step, a polymer forming gas may be used, thus allowing passivation of sidewalls. Consider the situation wherein, for example, vertical etching of silicon layer may occur during a first etch step using a fluorinated based gas such as $SF_6$. At deposition step, part of sidewalls (402 and 404) and horizontal surface 406 may be passivated using a polymer forming gas such as $C_4F_8$. These two steps may be alternated with the removal rate of the first etch step greater than the passivation rate of the deposition step until threshold point (e.g., approximately the remaining 10 percent of silicon layer, in an embodiment) has been reached. In an embodiment, more than one process recipes may be used during main etch step. A need for a plurality of process recipes during main etch step may depend upon requirements of devices being created.

TABLE 1

Example of Main Etch Step Parameters

| Parameters | During Deposition Step | During Etch Step |
|---|---|---|
| Top Power | 100 W-5000 W | 100 W-5000 W |
| Bottom Power | 1 W-500 W | 1 W-500 W |
| Chamber Pressure | 5 millitorrs-200 millitorrs | 5 millitorrs-200 millitorrs |
| Gas Mixture | $C_4F_8$ | $SF_6$ |

Table 1 above shows an example of some of the parameters for the etch step and the deposition step for a high frequency plasma system. In an embodiment, the main etch step may include more than one process recipe. In an example, the first etch step may employ a process recipe that is different than a process recipe employed by the deposition step. Note that process recipes for the main etch step may depend upon type of substrate and plasma processing system that may be utilized.

In an example, process recipes for the first etch step and/or the deposition step may allow for a top power to be between about 100 W and about 5000 W, preferred range may be approximately 400 W to approximately 3000 W. One skilled in the art is aware that top power is usually used as a power source to generate plasma. Also, process recipes for the etch step and/or the deposition step may provide for a bottom power, which may be employed to manipulate ions. Bottom power may be selected between about 1 W to about 500 W. In a high frequency plasma system, a preferred range may be about 1 W to about 300 W. In some embodiments, a preferred range may be doubled in a low frequency plasma system. As for chamber pressure, process recipes for the etch step and/or the deposition step may allow for a range of about 5 millitorrs to about 200 millitorrs. Preferably, chamber pressure may be at least 50 millitorrs. Further, although different type of gases may be utilized as an etchant, a fluorinated-based gas mixture is preferred.

Figure 5:
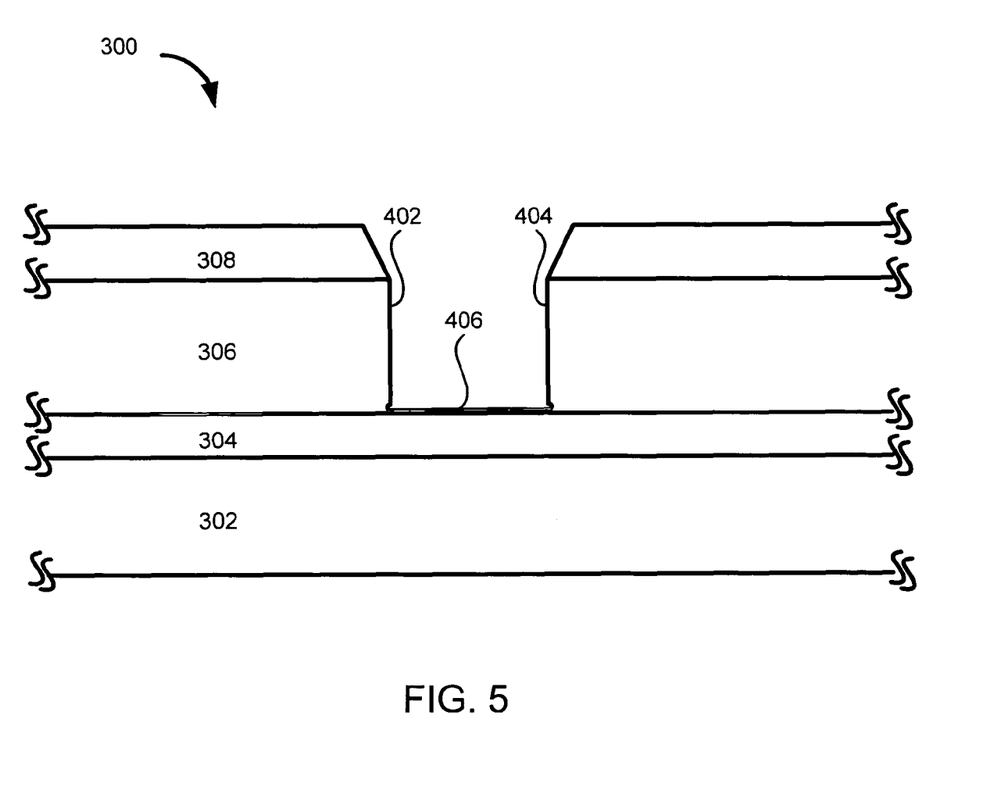
FIG. 5 shows, in an embodiment, how an overetching process may be used to limit lateral etching that may transpire.

Once a threshold point has been reached, different process recipes may be applied during an overetch step of NSPP. Referring back to FIG. 2, at a next step 206, etching silicon layer may continue with an overetch step. In an embodiment, an overetching process may be used to limit lateral etching that may transpire, as shown in FIG. 5. Process recipes for overetch step 206 may be different than the process recipes in main etch step 204. In an embodiment, overetch step 206 may include two substeps: a second etch substep and a passivation substep.

Referring back to FIG. 2, at a next substep 208, a second etch substep may include etching the silicon layer at a first bottom power level for a pre-determined time period. At a next substep 210, a passivation substep may begin at a lower second bottom power level for a pre-determined time period. During the passivation substep, part of sidewalls (402 and 404) and horizontal surface 406 may be passivated.

TABLE 2

Example of Overetch Step Parameters

| Parameters | During Second Etch Substep | During Passivating Substep |
|---|---|---|
| Top Power | 100 W-5000 W | 100 W-5000 W |
| Bottom Power | 1 W-500 W | 1 W-500 W |
| Chamber Pressure | 5 millitorrs-200 millitorrs | 5 millitorrs-200 millitorrs |
| Gas Mixture | $SF_6/O_2/N_2/Ar$ | $SF6/02/N2/Ar$ |

Table 2 above shows an example of some of the parameters for the second etch substep and the passivating step in a high frequency plasma system. In an embodiment, the overetch step may include more than one process recipe. In an example, the second etch step may employ a process recipe that is different than a process recipe employed by the passivation step. Similar to process recipes for the main etch step, process recipes for the overetch step may depend upon type of substrate and device that may be desired.

Process recipes for the second etch step and/or the passivation step may allow for a top power and chamber pressure which may be similar to a main etch step. Also, process recipes for the second etch step and/or the passivation step may allow for top power to be constant. In an embodiment, preferred range for top power may vary depending upon the etching rate. If a fast etching rate is desired, preferred range for top power may be about 800 W to about 3000 W. If etching is performed at a slower rate, than preferred range for top power may be about 200 W to about 600 W.

However, a bottom power and gas mixture may differ. By controlling bottom power level applied at each period in an overetch step, the lateral etching component may be controlled; thus, notching may be substantially reduced or eliminated during etching of the silicon layer.

TABLE 3

Power Ranges for Bottom Power Level During Overetch Step

| Parameters | During Second Etch Substep | During Passivation Substep |
|---|---|---|
| Preferred Range | 50 W-300 W | 0 W-100 W |
| More Preferred Range | 50 W-200 W | 0 W-50 W |

Process recipes for the overetch step may provide for a much lower bottom power range (e.g., 0 W to 300 W) than that of a main etch step. By reducing the bottom power level, etching rate may be significantly reduced to allow for a more controlled and precise etching of the remaining silicon layer.

Table 3 shows some examples of bottom power ranges during the second etch substep and the passivation substep. Preferred range for bottom power during the second etch substep may be about 50 W to about 300 W, with a more preferred range for bottom power of about 50 W to about 200 W. Likewise, preferred range may be about 0 W to about 100 W, with a more preferred range of about 0 W to about 50 W. Note that the bottom power level of the passivating substep may be as low as 0 W, since etching usually does not occur when bottom power is at 0 W.

TABLE 4

Time Ranges for Bottom Power Level

| Parameters | Overetch Step | 2nd Etch Substep | Passivation Substep |
|---|---|---|---|
| Preferred Range | 1 microsecond-10 seconds | 1 microsecond-10 seconds | 1 microsecond-3 seconds |
| More Preferred Range | 1 millisecond-1 second | 1 millisecond-1 second | 1.5 millisecond-1 second |
| At | 1 second | 1 second | 1 second |
| Duty Cycle | 1% to 99% | 1% to 99% | 1% to 99% |

Table 4 above shows some examples of time ranges for bottom power level of a high frequency plasma system. Time ranges during the overetch step may preferably be between about 1 microsecond and about 10 seconds, more preferably between about 1 millisecond and about 1 second, and preferably at about 1 second. Time ranges for the second etch substep may preferably be between about 1 microsecond and about 10 seconds, more preferably between about 1 millisecond and about 1 second, and preferably at about 1 second. In the passivation substep, time ranges may preferably be between about 1 microsecond and about 3 seconds, more preferable between about 1.5 millisecond and about 1 second, and preferably at about 1 second.

Overetch step may include alternating the RF bias at different power levels during each cycle. Time duration for each substep may vary depending upon the duty cycle. Consider the situation wherein, for example, the duty cycle is 50 percent (i.e., 50/50). With a duty cycle of 50 percent (i.e., 50/50), the second etch substep and the passivation substep may share equal time. In another example, a duty cycle of 70 percent (i.e., 70/30) may refer to an overetch step in which the second etch substep may be longer (i.e., 70 percent) than the passivation substep (i.e., 30 percent).

As bottom power levels alternate between higher and lower levels, a process recipe may allow for a bottom power level to be altered during each cycle. In an example, during a first cycle, the process recipe may call for a power level at passivation step to be 0 W. At a next cycle, the process recipe may require power level at passivation step to be increased to 2 W. Complexity of process recipe may depend upon requirements of device being created and capability of plasma processing system being utilized.

Another factor that may help control a lateral etching component may be the gas mixture that may be utilized during each alternating etching and passivating substeps. Although different type of gases may be used as an etchant, a fluorinated based gas such as $SF_6$ may be a more superior etchant for etching silicon layer than other gas mixtures such as chlorine based gases. In the passivation substep, an oxygen based gas such as $O_2$ may be used to allow for passivation of silicon sidewalls. In both, the second etch and the passivation substeps, a combination of a fluorinated and oxygen based gas compound (e.g., $SF_6$, $SF_6:O_2$, $SF_6:O_2$, $SF_6:O_2:N_2$, $O_2$, $O_2:N_2$, etc.) may be used, in an embodiment. In addition, gas combination may be altered during each alternating cycle depending upon requirements of devices being created.

Figure 6:
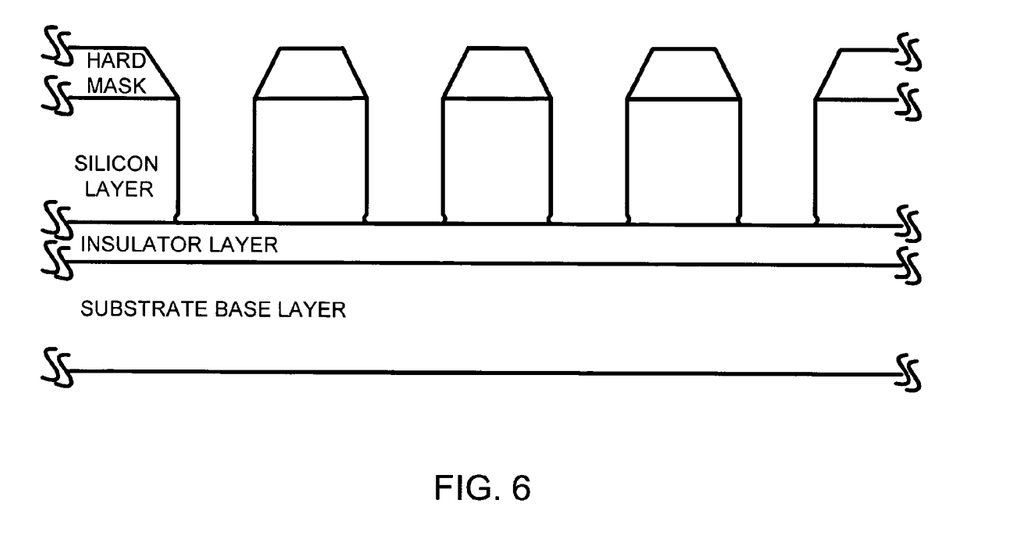
FIG. 6 shows, in an embodiment, a silicon layer of a substrate after NSPP.

At a next step 212, the method determines whether a silicon layer is completely etched. If a silicon layer is not completely etched, the method returns to step 206 to continue etching silicon layer. By alternating between the second etch substep and the passivation substep, the remaining thickness of the silicon layer may be etched with substantially little notching occurring. Terminating the overetch step may be determined using an optical emission endpoint method. If the silicon layer is completely etched, the method continues to post silicon etch processing. FIG. 6 shows, in an embodiment, a silicon layer of a substrate after NSPP.

As can be appreciated from the embodiments of the invention, NSPP provides for an effective method of controlling lateral etching that may occur, thereby significantly shrinking the size of notches that tend to occur during etching of silicon substrate. With NSPP, manufacturing companies may continue to utilize the benefits of a high frequency plasma processing system, without compromising control of lateral etching component. Further, as NSPP does not require hardware changes, manufacturing companies may appreciate significant financial benefits gained from a reduction in the number of defective devices created.

While this invention has been described in terms of several embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In a plasma processing chamber, a method for etching a substrate having thereon a silicon layer, said plasma processing chamber having a bottom electrode, said substrate being disposed on said bottom electrode during said etching, comprising:
    performing a main etch step;
    terminating said main etch step when a predefined etch depth into said silicon layer is achieved, said predefined etch depth being at least 70 percent of a thickness of said silicon layer;
    performing an overetch step, said overetch step including a first process step and a second process step, said first process step being performed using a first bottom power level applied to said bottom electrode, said second process step being performed using a second bottom power level applied to said bottom electrode that is lower than said first bottom power level, wherein said first process step and said second process step are alternately performed a plurality of times; and
    terminating said overetch step after said silicon layer is etched through.

2. The method of claim 1 wherein said first process step employs a first process recipe that is configured to remove more silicon material from said silicon substrate than a second process recipe employed by said second process step.

3. The method of claim 1 wherein said second bottom power level is substantially zero watt.

4. The method of claim 1 wherein said main etch step includes a third process step and a fourth process step, said third process step employing a third process recipe that is configured to remove more silicon material from said silicon substrate than a fourth process recipe employed by said fourth process step.

5. The method of claim 4 wherein said first process step and said second process step employ a first gas mixture, said third process step and said fourth process step employ a second gas mixture different from said first gas mixture.

6. The method of claim 5 wherein said third process step employs a gas mixture that is different from a gas mixture employed during said fourth process step.

7. The method of claim 1 wherein said overetch step employs a gas mixture that different from a gas mixture employed during said main etch step.

8. The method of claim 1 wherein said main etch step employs a third bottom power level that is higher than either said first bottom power level or said second bottom power level.

9. The method of claim 1 wherein said predefined etch depth being at least 80 percent of said thickness of said silicon layer.

10. The method of claim 1 wherein said predefined etch depth being at least 90 percent of said thickness of said silicon layer.

11. The method of claim 1 wherein said first process step employs a gas mixture that is different from a gas mixture employed during said second process step.

12. The method of claim 1 wherein a duration of said first process step is substantially the same as a duration of said second process step.

13. The method of claim 1 wherein said duration of said first process step is greater than said duration of said second process step.

14. The method of claim 1 wherein said duration of said first process step is less than said duration of said second process step.

15. The method of claim 1 wherein said first process step lasts between about 1 microsecond and about 10 seconds, said second process step lasts between about 1 microsecond and about 3 seconds.

16. The method of claim 1 wherein said terminating said overetch step is determined using an optical emission endpoint method.

17. In a plasma processing chamber, a method for etching a substrate having thereon a silicon layer, said plasma processing chamber having a bottom electrode, said substrate being disposed on said bottom electrode during said etching, comprising:
    performing a main etch step, said main etch step includes a first process step and a second process step, said first process step employing a first process recipe that is configured to remove more silicon material from said silicon substrate than a second process recipe employed by said second process step;
    terminating said main etch step when a predefined etch depth into said silicon layer is achieved, said predefined etch depth being at least 70 percent of a thickness of said silicon layer;
    performing an overetch step, said overetch step including a third process step and a fourth process step, said third process step being performed using a first bottom power level applied to said bottom electrode, said fourth process step being performed using a second bottom power level applied to said bottom electrode that is lower than said first bottom power level, wherein said third process step and said fourth process step are alternately performed a plurality of times; and terminating said overetch step after said silicon layer is etched through.

18. The method of claim 17 wherein said third process step employs a third process recipe that is configured to remove more silicon material from said silicon substrate than said a fourth process recipe employed by said fourth process step.

19. The method of claim 17 wherein said second bottom power level is substantially zero watt.

20. The method of claim 17 wherein said third process step and said fourth process step employ a first gas mixture, said first process step and said second process step employ a second gas mixture different from said first gas mixture.

21. The method of claim 17 wherein said overetch step employs a gas mixture that is different from a gas mixture employed during said main etch step.

22. The method of claim 17 wherein said main etch step employs a third bottom power level that is higher than either said first bottom power level or said second bottom power level.

23. The method of claim 17 wherein said predefined etch depth being at least 80 percent of said thickness of said silicon layer.

24. The method of claim 17 wherein said predefined etch depth being at least 90 percent of said thickness of said silicon layer.

25. The method of claim 17 wherein said third process step employs a gas mixture that is different from a gas mixture employed during said fourth process step.

26. The method of claim 17 wherein a duration of said third process step is substantially the same as a duration of said fourth process step.

27. The method of claim 17 wherein a duration of said third process step is greater than a duration of said fourth process step.

28. The method of claim 17 wherein a duration of said third process step is less than a duration of said fourth process step.

29. The method of claim 17 wherein said third process step lasts between about 1 microsecond and about 10 seconds, said fourth process step lasts between about 1 microsecond and about 3 seconds.

30. The method of claim 17 wherein said terminating said overetch step is determined using an optical omission endpoint method.

31. The method of claim 17 wherein said first process step employs a gas mixture that is different from a gas mixture employed during said second process step.

* * * * *